(12) United States Patent
Okunami et al.

(10) Patent No.: US 11,215,901 B2
(45) Date of Patent: Jan. 4, 2022

(54) MAGNETOMETER-BASED LENS CAP DETECTION

(71) Applicant: Plantronics, Inc., Santa Cruz, CA (US)

(72) Inventors: Alvin I. Okunami, Austin, TX (US); Denis Sychev, Corpus Christi, TX (US)

(73) Assignee: Plantronics, Inc., Santa Cruz, CA (US)

( * ) Notice: Subject to any disclaimer, the term of this patent is extended or adjusted under 35 U.S.C. 154(b) by 0 days.

(21) Appl. No.: 17/084,604

(22) Filed: Oct. 29, 2020

(65) Prior Publication Data

US 2021/0132467 A1 May 6, 2021

Related U.S. Application Data

(60) Provisional application No. 62/931,705, filed on Nov. 6, 2019.

(51) Int. Cl.
*G03B 11/04* (2021.01)
*G01R 33/00* (2006.01)
*G01R 33/02* (2006.01)
*H04N 5/225* (2006.01)

(52) U.S. Cl.
CPC ........ *G03B 11/041* (2013.01); *G01R 33/0047* (2013.01); *G01R 33/0206* (2013.01); *H04N 5/2254* (2013.01)

(58) Field of Classification Search
CPC .......................... G03B 11/041; G01R 33/0047
See application file for complete search history.

(56) References Cited

U.S. PATENT DOCUMENTS

| 7,568,848 B2* | 8/2009 | Ho ......................... G03B 17/02 359/507 |
| 9,465,276 B2* | 10/2016 | Jonsson ................. G06F 1/1686 |
| 2012/0194984 A1* | 8/2012 | Aikawa ............... H04M 1/0222 361/679.01 |
| 2014/0268517 A1* | 9/2014 | Moon ................... G06F 3/0416 361/679.01 |

* cited by examiner

*Primary Examiner* — Minh Q Phan
(74) *Attorney, Agent, or Firm* — Ferguson Braswell Fraser Kubasta PC (57) ABSTRACT

A video system includes a camera, at least one magnet providing a magnetic field, a magnetometer, and a processing system. The magnetometer is configured to measure the magnetic field to generate a magnetometer readout. The magnetic field is altered when a lens cap blocks a view of the camera. The processing system is configured to detect, based on the magnetometer readout of the magnetic field, whether the lens cap is blocking the view of the camera.

20 Claims, 6 Drawing Sheets

MAGNETOMETER-BASED LENS CAP DETECTION

CROSS REFERENCE TO RELATED APPLICATIONS

This application claims benefit under 35 U.S.C. § 119(e) to U.S. Provisional Patent Application Ser. No. 62/931,705 and filed on Nov. 6, 2019. U.S. Provisional Patent Application Ser. No. 62/931,705 is incorporated herein by reference in its entirety.

FIELD

The present disclosure relates generally to camera systems. More particularly, the present disclosure relates to camera systems equipped with removable camera lens covers.

BACKGROUND

When using a camera system, users may occasionally want to prevent the camera system from acquiring image data, for example, for privacy reasons. To some users, electronically disabling the camera may feel insufficient. Accordingly, camera systems may be equipped with a physical lens cap that blocks the view of the camera system.

SUMMARY

In general, in one aspect, one or more embodiments relate to a video system comprising: a camera; at least one magnet providing a magnetic field; a magnetometer configured to measure the magnetic field to generate a magnetometer readout, wherein the magnetic field is altered when a lens cap blocks a view of the camera; a processing system, configured to: detect, based on the magnetometer readout of the magnetic field, whether the lens cap is blocking the view of the camera.

In general, in one aspect, one or more embodiments relate to a method for detecting a lens cap on a camera, the method comprising: obtaining a magnetometer readout from a magnetometer configured to measure a magnetic field, wherein the magnetic field is provided by at least one magnet, and wherein the magnetic field is altered when the lens cap blocks a view of the camera detect, based on a magnetometer readout of the magnetic field, whether the lens cap is blocking the view of the camera.

In general, in one aspect, one or more embodiments relate to a non-transitory computer readable storage medium comprising instructions for: obtaining a magnetometer readout of a magnetic field from a magnetometer, the magnetic field being altered when a lens cap blocks a view of the camera; detecting, based on the magnetometer readout of the magnetic field, whether the lens cap is blocking the view of the camera; and presenting, based on the detecting, an indication of whether the lens cap is blocking the view of the camera.

Other aspects of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, although the description includes a discussion of various embodiments of the disclosure, the various disclosed embodiments may be combined in virtually any manner. All combinations are contemplated herein.

Embodiments of the disclosure enable a detection of whether or not a view of a camera is blocked by a lens cap. Blocking the view of a camera may be desirable, for example, to protect privacy.

In one or more embodiments, a magnetometer is used to detect whether or not the view of the camera is blocked by the lens cap. A magnetometer may be sensitive to even small magnetic fields such as the earth's magnetic field. The lens cap may include a ferromagnetic element or may entirely or mostly consist of a ferromagnetic material, and the presence or absence of the lens cap may, thus, alter a magnetic field, which may be sensed by the magnetometer.

Due to the sensitivity of the magnetometer, the change of the magnetic field may be detected over a significant distance, e.g., over multiple centimeters or more. Accordingly, unlike in other solutions that rely on mechanical switches or hall sensors, the magnetometer does not need to be placed in direct proximity to the lens cap. The magnetometer may be placed on an existing circuit board, and may thus, avoid additional wiring or other complexity, thereby also reducing cost.

Figure 1:
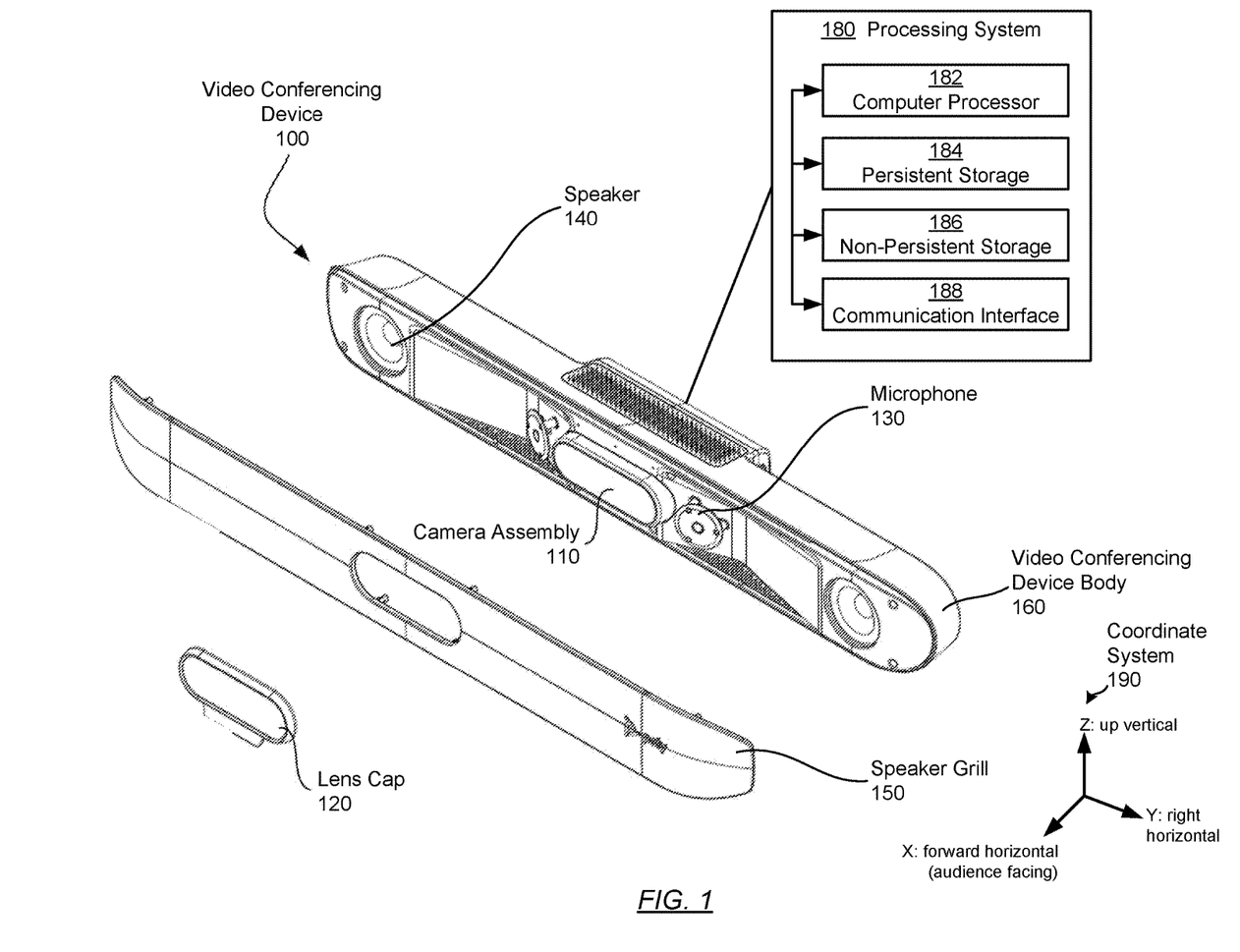
FIG. 1 shows a video-conferencing device, in accordance with one or more embodiments of the disclosure.

Turning to FIG. 1, a video conferencing device (100) in accordance with one or more embodiments is shown. The video conferencing device may include a camera assembly (110), a lens cap (120), one or more microphones (130), one or more speakers (140), a speaker grill (150), and a processing system (180). Each of these components may be integrated in or attached to a video conferencing device body (160).

The video conferencing device body (160) is a housing of the video conferencing device. The video conferencing device body (160) may be made of a plastic or metal material, and may be disposed above or below a video display, or may be placed in any other location suitable for the operation of the video conferencing device (100).

The camera assembly (110), in one or more embodiments, includes a camera for capturing images or video, e.g., in a video conference call scenario. The camera assembly (110) may further include other components, including components used for detecting whether or not the camera view is blocked by a lens cap. These and other aspects are discussed below, with reference to FIGS. 2A, 2B, and 2C. The camera assembly (110) may be disposed in the video conferencing device body (160), e.g., at a horizontally central location, to obtain alignment of the camera assembly with the center of a display screen that may be placed on top of or below the video conferencing device (100). In such a configuration, the video conferencing device (110) would be oriented such that the camera of the camera assembly (110) may obtain a full or partial view of a conference room or other site.

The lens cap (120) is used to block the view of the video conferencing device's camera, when installed. Blocking the view includes obfuscating the view (e.g., through a translucent lens cap) or completely obstructing the view (e.g., through an opaque lens cap). As shown in FIG. 1, the lens cap (120) may be removable and replaceable. In other configurations, the lens cap (120) may be non-removable. For example, the lens cap may be permanently attached to another component of the video conferencing device (100) and may be slidable or rotatable to block or unblock the view of the camera. In one of more embodiments, the lens cap is substantially flat, and may be shaped to substantially match the outline of the camera assembly (110) on the surface of the video conference device body (160). The lens cap may be made of a plastic material or of any other material. In one or more embodiments, the lens cap includes a ferromagnetic component. For example, the lens cap may include a layer of sheet metal, which may be disposed on the inside of the lens-cap, facing the video conferencing device (100) when covering the camera assembly (110).

The one or more microphones (130), may be used to capture audio, e.g., during a conference call. Multiple microphones may be used to capture directional audio and/or to facilitate speaker location, noise suppression, etc.

The one or more speakers (140), may be used to output audio, e.g., to a local audience facing the video conferencing device (100).

The speaker grill (150) may be disposed on the video conferencing device to cover the front of the video conferencing device (100). The speaker grill may be meshed to avoid acoustic obstruction of the microphone(s) (130) and speaker(s) (140). The speaker grill, in one or more embodiments, includes a cutout for the camera assembly (110). When installed, the lens cap (120) may be substantially flush with the surface of the speaker grill (150). To obtain a uniform appearance, the surface of the lens cap (120) may be textured similar to the speaker grill (150).

The processing system (180) may include various components such as one or more computer processors (182), persistent storage (184), non-persistent storage (186), and a communication interface (188).

The one or more computer processors (182) may include one or more integrated circuits for processing instructions. For example, the computer processor(s) (182) may be one or more cores or micro-cores of a processor. The computer processor(s) (182) may receive data values from the magnetometer (described with reference to FIG. 3), e.g., via an I2C bus or any other bus. The computer processor(s) (182) may process the magnetometer data values to determine whether or not a lens cap is blocking the view of the camera. To determine whether or not a lens cap is blocking the view of the camera, the computer processor(s) (182) is executing instructions that may be based on one or more of the method steps described with reference to FIGS. 4 and 5. In addition, the processor(s) (182) may perform other operations, e.g., to process audio and/or video signals associated with the one or more microphones (130) and/or the one or more speakers (140).

The persistent storage (184) may be any type of non-transitory computer readable medium, such as flash memory, hard disk, an optical drive such as a compact disk (CD) drive or digital versatile disk (DVD) drive, etc., storing, for example, an operating system, and/or instructions, e.g., instructions implementing one or more of the steps of the methods described below with reference to the flowcharts of FIGS. 4 and 5.

The non-persistent storage (186) may be volatile memory, such as random-access memory (RAM) and/or cache memory, used when executing the steps of the methods described below.

The communication interface (188), in one or more embodiments, may be, for example, a network interface (such as an Ethernet or WLAN interface). Those skilled in the art will appreciate that any type of communication interface that allows the transmission of audio and video signals in digital or analog format may be used.

FIG. 1 also includes a coordinate system establishing directions for an x-coordinate (arrow pointing in a forward, horizontal direction (e.g., toward an audience in a conference room), a y-coordinate (arrow pointing in a right horizontal direction), and a z-coordinate (arrow pointing in an up vertical direction). The coordinate system is later referred to, to discuss directionality as it may affect embodiments of the disclosure.

While FIG. 1 shows a configuration of components, other configurations may be used without departing from the scope of the disclosure. For example, while embodiments of the disclosure are discussed within the scope of a video conferencing device, embodiments of the disclosure may, more generally, include all types of video systems that include a camera, for example, a web cam, a DSLR type camera, etc.

Figure 2A:
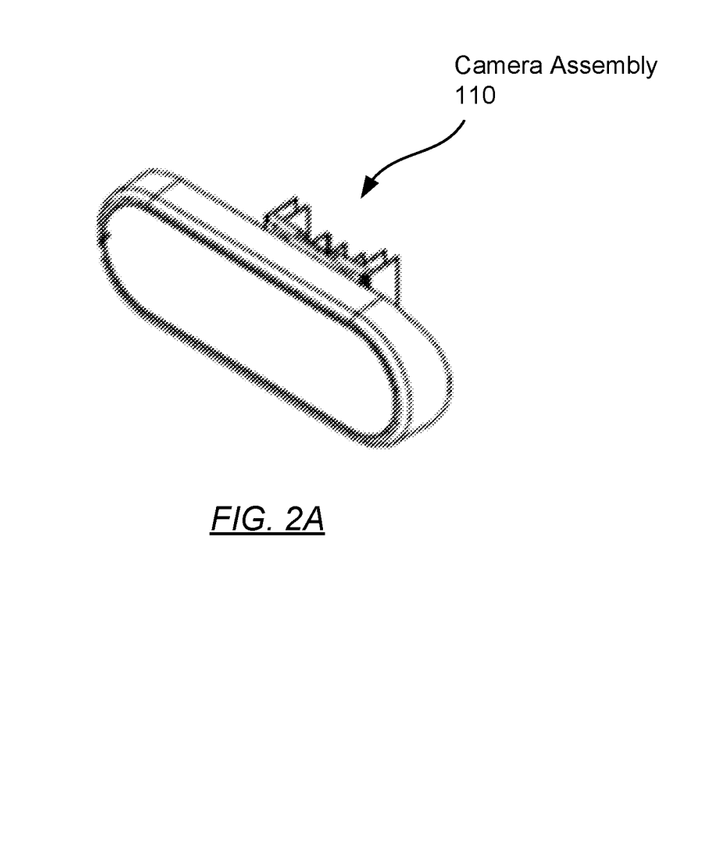
FIGS. 2A, 2B, and 2C show camera assemblies, in accordance with one or more embodiments of the disclosure.
Figure 2B:
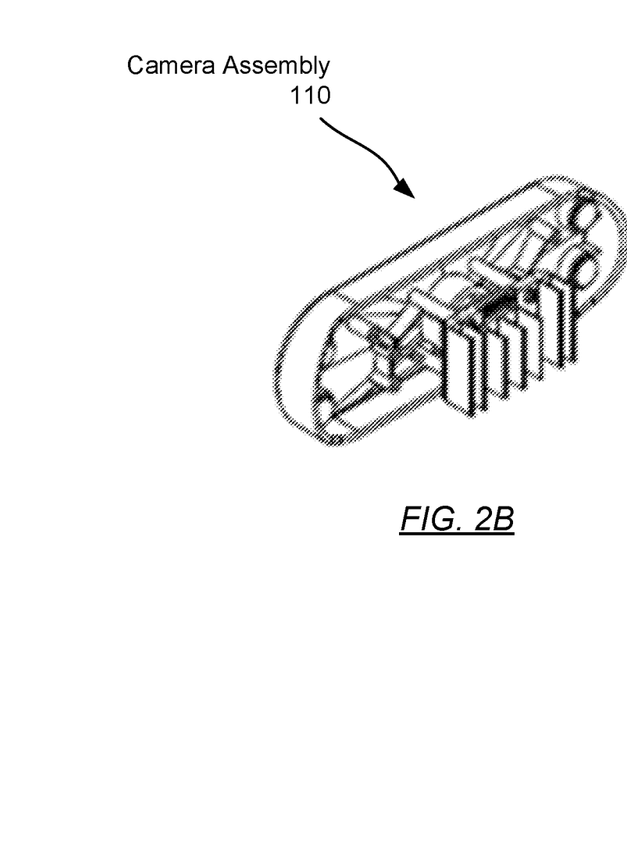
Figure 2C:
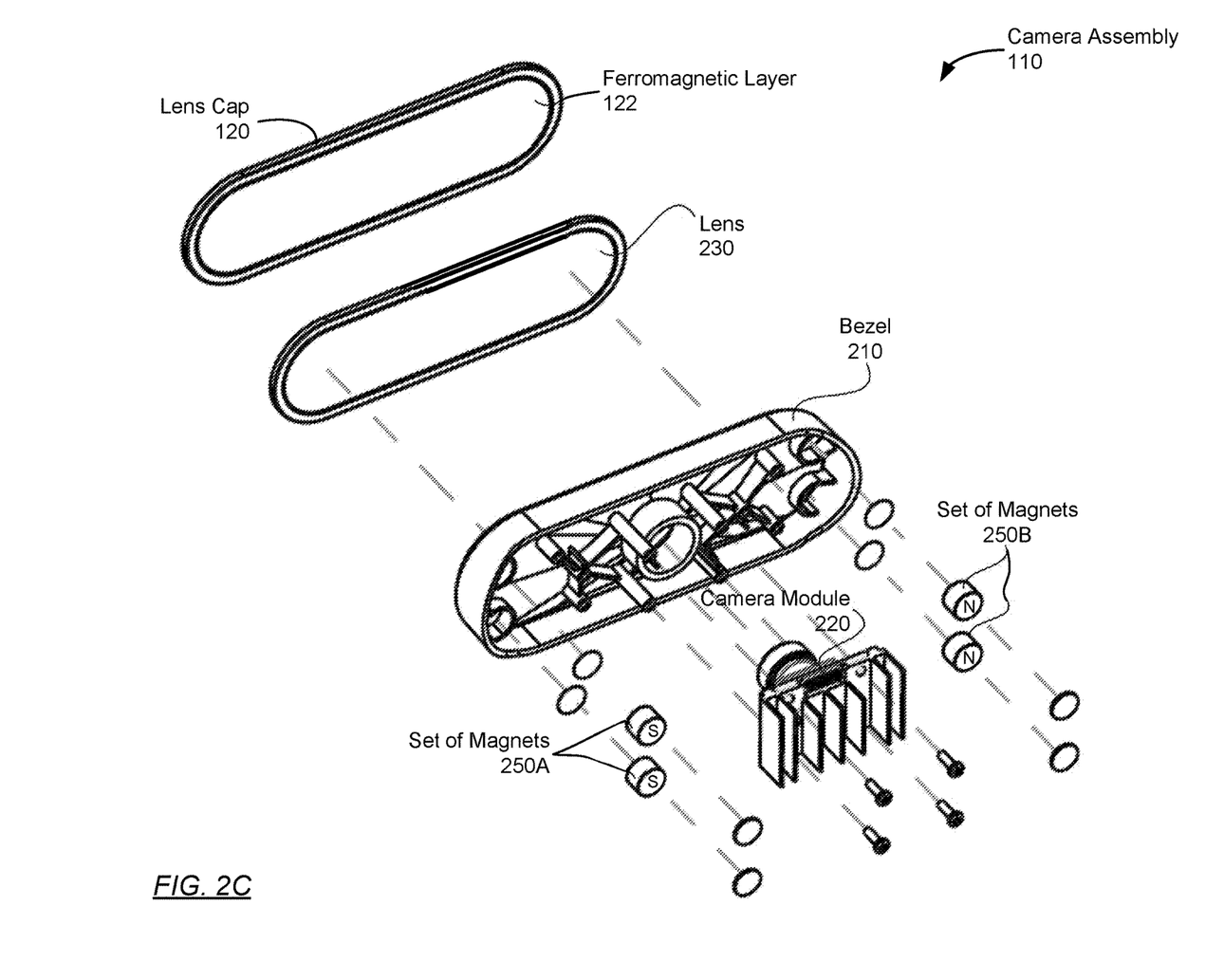

Turning to FIGS. 2A, 2B, and 2C, camera assemblies (110), in accordance with one or more embodiments, are shown. FIG. 2A includes a perspective view of the camera assembly (110), primarily showing the front of the camera assembly, which, in a video conferencing device (100) would face forward, e.g., facing video conferencing participants in a conference room. FIG. 2B includes a perspective view of the camera assembly (110), primarily showing the back of the camera assembly (110), which would be inside the video conferencing device body (160). FIG. 2C includes an exploded view of the camera assembly (110), showing various components of the camera assembly (110). In addition, FIG. 2C also shows the lens cap (120) as it would be placed to block the view of the camera.

In one or more embodiments, the camera assembly (110) includes a bezel (210), a camera module (220), a lens (230), and two sets of magnets (250A, 250B).

The bezel (210) may be a structural element configured to support other elements of the camera assembly (110). Specifically, the bezel (210) may support the camera module (220), the sets of magnets (250A, 250B), and the lens (230). The camera module (220), the sets of magnets (250A, 250B), the lens (230), and other elements may be screwed, clipped, glued, or otherwise attached to the bezel (210).

The camera module (220) may include a camera and may further include other elements such as printed circuit boards, heat sinks, electrical interfaces, etc. Any type of camera may be included in the camera module (220). For example, the camera may be a CCD or CMOS camera. A single camera may be used, or multiple cameras may be used to obtain a stereoscopic image. Other imaging techniques such as depth-sensing cameras may be used without departing from the disclosure.

The lens (230) may be located in front of the camera module (220), e.g., to provide mechanical protection of the camera module (220), and/or to provide a visually appealing uniform surface covering the bezel (210). The lens (230) may be made of a transparent material, e.g., glass or plexiglass. In the embodiment shown in FIG. 2C, the lens (230) is shaped to cover the bezel (210). Those skilled in the art will appreciate that the lens (230) may have any shape that does not necessarily have to coincide with the shape of the bezel (210).

The embodiment shown in FIG. 2C includes two sets of magnets (250A, 250B). The sets of magnets (250A, 250B) may be used to hold the lens cap (120) when placed to cover the lens (230). The sets of magnets (250A, 250B) emit a magnetic field (not shown), which may be sensed by a magnetometer, as discussed below with reference to FIG. 3.

In one embodiment, the first set of magnets (250A) and the second set of magnets (250B) are installed to have opposite polarity, and are located on substantially opposite sides of the camera module (220). In particular, one set of one or more magnets are located on a first side of the camera and a second set of one or more magnets are located on a second side of the camera. The forward-facing direction of the camera (e.g., the direction in which the camera faces) is defined as a plane of the view of the camera. A plane of the lens of the camera is perpendicular to the plane of the view of the camera and is parallel to the lens. As shown in FIG. 2C, the sets of magnets are on opposing sides of the camera along the plane of the lens of the camera. Being along the plane of the lens of the camera includes substantially along the plane (e.g., within 30 degrees). Further, the sets of magnets may each include at least two magnets. The two magnets may be spaced so as to be vertically opposite sides of the camera as shown in FIG. 2C.

Placement of the lens cap (120) may have a particularly strong effect on the magnetic field of the first and second sets of magnets (250A, 250B), because the magnetic field lines between the first and second sets of magnets (250A, 250B) may be channeled through the ferromagnetic layer (122) of the lens cap (120), when the lens cap is installed. Accordingly, a particularly strong change in the magnetic field may be sensed by the magnetometer when the lens cap (120) is placed or removed. In the example of FIG. 2C, the lens cap (120) includes an insert providing a ferromagnetic layer (122), on the lens-facing side of the lens cap. Alternatively, the lens cap (120) may be partially or entirely made of a ferromagnetic material.

While FIG. 2C shows a configuration that includes two set of two magnets (250A, 250B), any number of magnets in any configuration may be used, without departing from the disclosure. For example, in one embodiment (not shown), a magnet is disposed on the lens cap, or on an extension of the lens cap. In this embodiment, the lens cap is slidable between two positions blocking the camera view and not blocking the camera view. The resulting change in the magnet location may be sensed by the magnetometer. In another embodiment, the lens cap is rotatable, with an adjustable aperture blocking or not blocking the camera view when rotating the lens cap. The resulting change in the magnet location may be sensed by the magnetometer.

Figure 3:
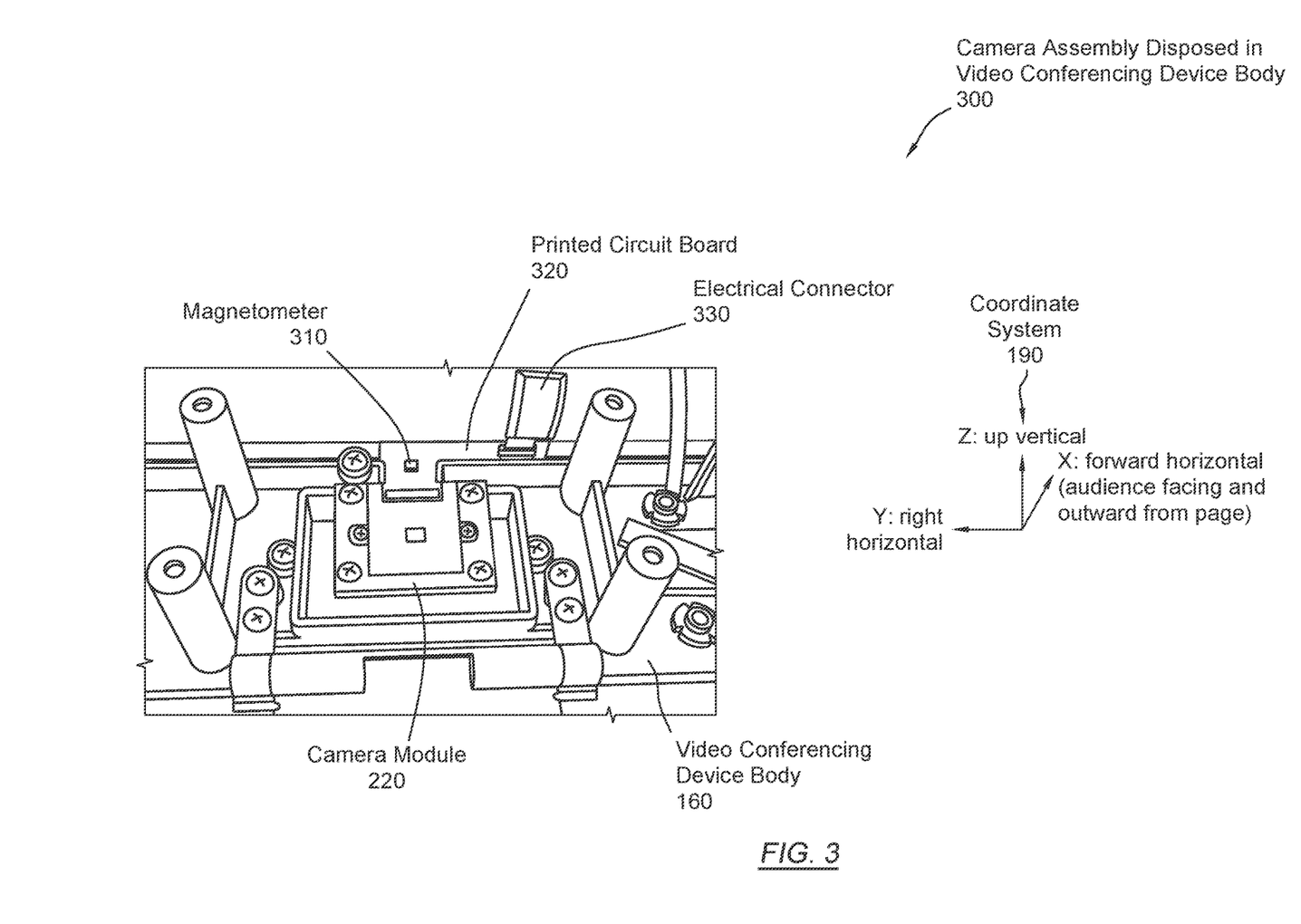
FIG. 3 shows a camera assembly disposed in a video conferencing device body, in accordance with one or more embodiments of the disclosure.

Turning to FIG. 3, a camera assembly, disposed in a video conferencing device body (300), in accordance with one or more embodiments, is shown. More specifically, FIG. 3 shows the video conferencing device body (160), with the camera module (220) of the camera assembly (110) being visible on the inside of the video conferencing device body (160), when disassembled. To relate the components shown in FIG. 3 to the same components shown, for example, in FIG. 1, FIG. 3 also includes the coordinate system of FIG. 1, with the directional arrows updated based on the perspective view in FIG. 3 differing from the perspective view in FIG. 1.

FIG. 3 further shows a magnetometer (310), installed on a printed circuit board (320) disposed in the video conferencing device body. In one or more embodiments, the magnetometer (310) is a device that measures magnetism, for example in the x, y, and z directions. The magnetometer (310) is integrated in a semiconductor chip and outputs magnetic field values, e.g., in the x, y, and z directions, in analog and/or digital format. Because placement or removal of the lens cap (120) alters the magnetic field, the placement or removal of the lens cap may be detected based on a change in one or more of the magnetic field values obtained from the magnetometer (310). Methods, described with reference to FIGS. 4 and 5, may thus be used to detect the placement or removal of the lens cap (120). Magnetometers tend to be highly sensitive to magnetic field changes. For example, a magnetometer may sense the Earth magnetic field, which is much weaker than the magnetic field produced by the sets of magnets (250A, 250B). Accordingly, a change in the magnetic field may be detected by the magnetometer (310), even if the magnetometer is not in direct proximity to the lens cap (120), for example, multiple centimeters (2, 3, 4, 5, etc. centimeters) away from the lens cap when installed.

In the example shown in FIG. 3, the magnetometer is installed on a printed circuit board (320) that serves dual purposes. The printed circuit board (320) supports a set of status LEDs of the video conferencing device (100). The printed circuit board (320) is further used to accommodate the magnetometer (310). In other words, the magnetometer (310) shares the circuit board (320) with user interface components of the video conferencing device (100). An electrical connector (330) may interface the status LEDs and the magnetometer (310) with other components of the video conferencing device (100), e.g., the processing system (180). Accordingly, an already existing component (the printed circuit board (320)) may be used to accommodate the magnetometer (310), instead of requiring the installation of the magnetometer at a separate location, which would require additional installation components, wiring, etc.

Figure 4:
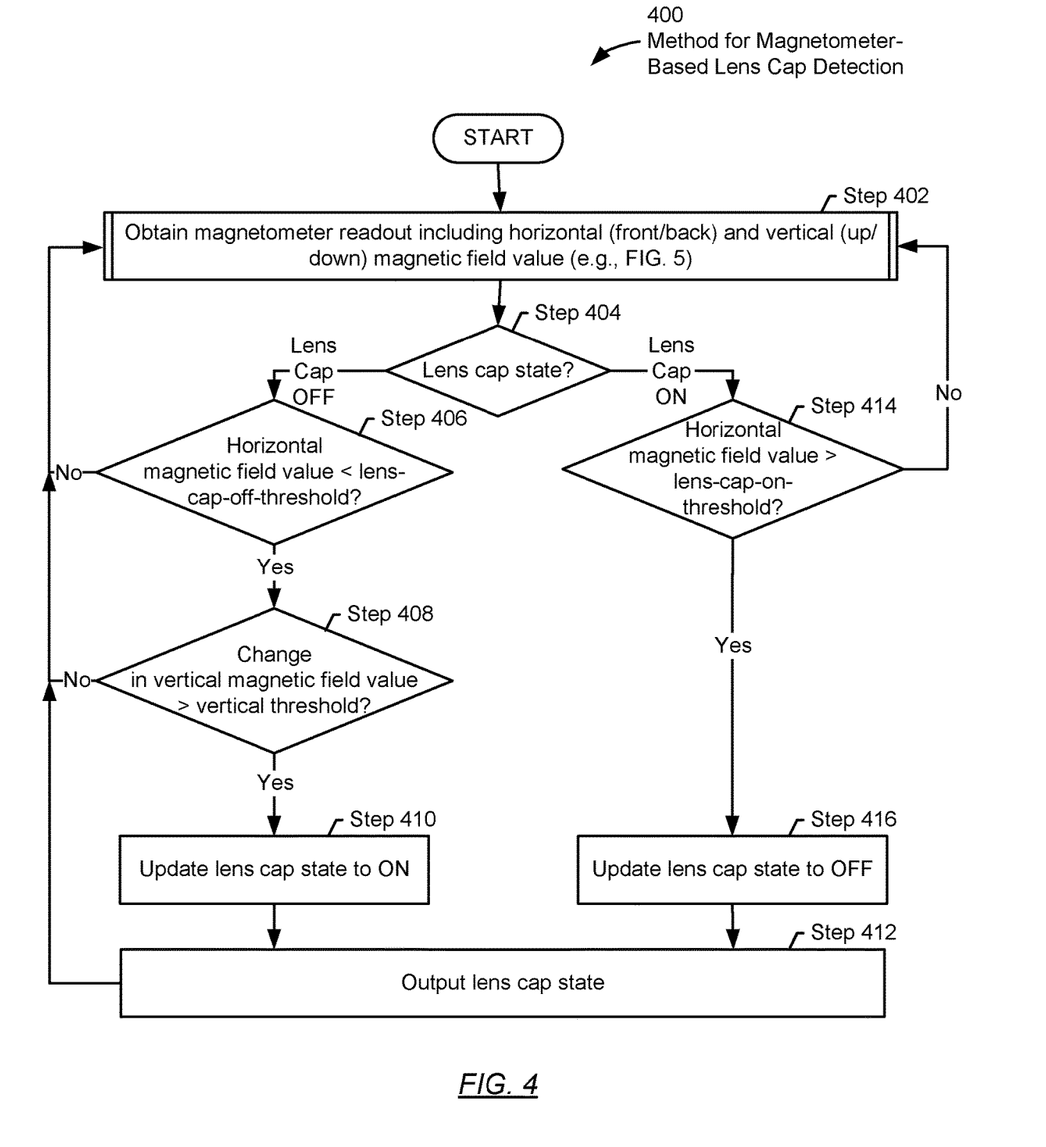
FIG. 4 shows a flowchart describing a method for a magnetometer-based lens cap detection, in accordance with one or more embodiments of the disclosure.
Figure 5:
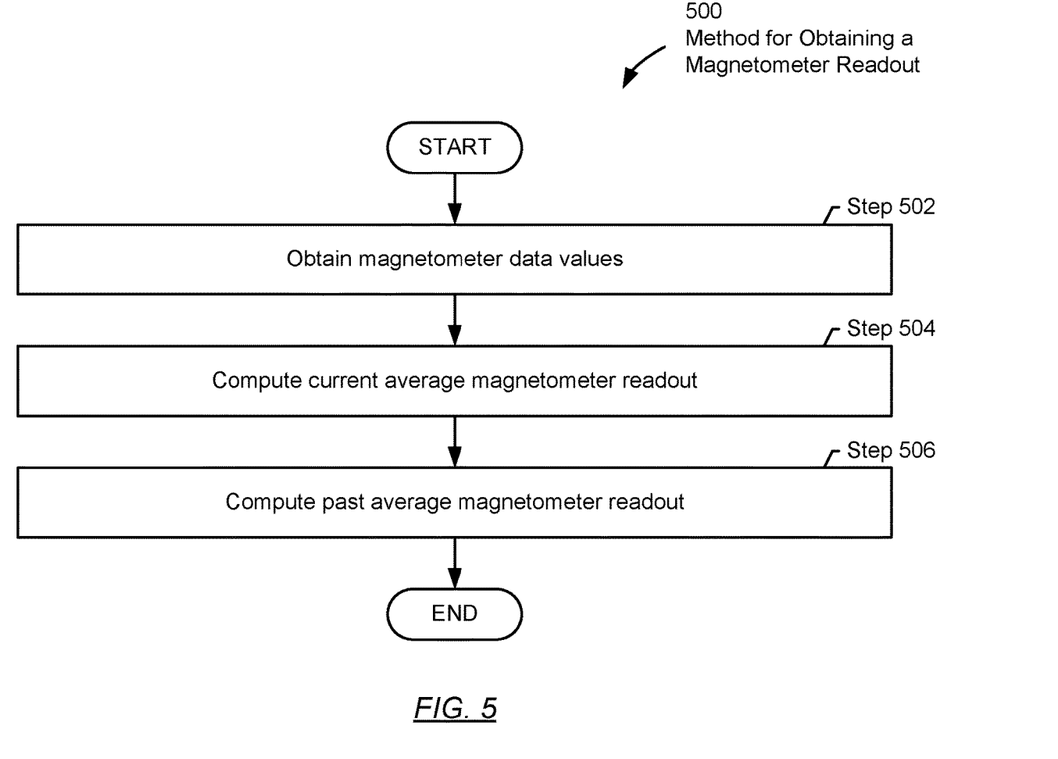
FIG. 5 shows a flowchart describing a method for obtaining a magnetometer readout, in accordance with one or more embodiments of the disclosure.

FIG. 4 and FIG. 5 show flowcharts in accordance with one or more embodiments. One or more of the steps in FIG. 4 and FIG. 5 may be performed by various components of the video conferencing device, or more generally, video system, previously described with reference to FIG. 1.

While the various steps in these flowcharts are presented and described sequentially, one of ordinary skill will appreciate that some or all of the steps may be executed in different orders, may be combined or omitted, and some or all of the steps may be executed in parallel. Additional steps may further be performed. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention. Accordingly, the scope of the disclosure should not be considered limited to the specific arrangement of steps shown in FIG. 4 and FIG. 5.

Turning to the flowchart of FIG. 4, a method (400) for a magnetometer-based lens cap detection, in accordance with one or more embodiments, is shown. Broadly speaking, the method may update a variable that represents a lens cap state. The lens cap state may be ON or OFF. The lens cap state may be updated to ON when the lens cap is found to be blocking the view of the camera. Referring to FIGS. 1-3, the lens cap state ON may correspond to the lens cap being placed over the lens. The lens cap state may be updated to OFF when the lens cap is found not to be blocking the view of the camera. Referring to FIGS. 1-3, the lens cap state OFF may correspond to the lens cap being removed. The updating of the lens cap state may be performed based on a magnetometer readout. While initially, e.g., during system initialization, the lens cap state may be initialized to either ON or OFF, execution of the steps as subsequently described result in a detection of whether the lens cap is blocking the view of the camera or not, allowing the lens cap state to be correctly set.

In Step 402, a magnetometer readout is obtained. The magnetometer measures the magnetic field to generate a magnetometer readout. The magnetometer readout may be passed to a processing system. The magnetometer readout may include a current average magnetometer readout and a past average magnetometer readout. The current average magnetometer readout and the past average magnetometer readout may include a horizontal magnetic field value and a vertical magnetic field value. The horizontal and vertical magnetic field values may be in x and y directions of the coordinate system discussed with reference to FIG. 3. Additional details are provided below with reference to FIG. 5.

In Step 404, the current lens cap state is checked. As previously described, the lens cap state may be either ON or OFF. The current lens cap state may be checked by inspecting the variable storing the lens cap state. If the lens cap state is determined to be OFF, the method may proceed with the execution of Step 406. Step 406, followed by Step 408 are intended to determine whether the lens cap has been placed to cover the view of the camera. When if the lens cap is detected, the lens cap state is updated to ON.

If the lens cap state is determined to be ON, the method may proceed with the execution of Step 414. Step 414 is intended to determine whether the lens cap has been removed, thus no longer covering the view of the camera. When the absence of the lens cap is detected, the lens cap state is updated to OFF.

In Step 406, a test is performed to determine whether the horizontal magnetic field value is less than a lens-cap-off threshold. The lens-cap-off-threshold may be set such that, when the horizontal magnetic field value is above the lens-cap-off-threshold, the test in Step 406 would predict that the lens cap is present, thus blocking the view of the camera. When the horizontal magnetic field value is below the lens-cap-off-threshold, the test in Step 406 would predict that the lens cap is absent, thus not blocking the view of the camera. In one or more embodiments, the distinction between the lens cap being present or absent is based on the change of the magnetic field in the x direction, as sensed by the magnetometer. More specifically, when the lens cap is blocking the view of the camera (lens cap present), the horizontal magnetic field sensed by the magnetometer is reduced because the magnetic field of the set of magnets (shown in FIG. 2C) is concentrated in the ferromagnetic component of the lens cap. When the lens cap is absent (i.e., not blocking the view of the camera), the magnetic field is not concentrated in the ferromagnetic component of the lens cap. Because the lens magnetic field is not concentrated in the ferromagnetic component, the magnetometer is exposed to a stronger magnetic field in the x direction. The stronger magnetic field results in an increased horizontal magnetic field sensed by the magnetometer. The lens-cap-off-threshold may be set as a value between the horizontal magnetic field value obtained when the lens cap is present, and the horizontal magnetic field value obtained when the lens cap is absent. By setting the lens-cap-off-threshold to a value between the horizontal magnetic field values when the lens cap is present and the lens cap is absent, the distinction of lens cap present and lens cap absent is enabled. If the horizontal magnetic field value is below the lens-cap-off-threshold, the execution of the method may proceed with Step 408. If the horizontal magnetic field value is not below the lens-cap-off-threshold, the execution of the method may return to Step 402, without updating the lens cap state.

In Step 408, a test is performed to determine whether a change in the vertical magnetic field value is greater than a vertical threshold. The change in the vertical magnetic field value may be computed by subtracting the past average magnetometer readout from the current average magnetometer readout. The vertical threshold may be set such that the lens cap detected as being present (i.e., blocking the view of the camera), in Step 406, is accepted as a true positive when the change in the vertical magnetic field value is above the vertical threshold. When the change in the vertical magnetic field value is below the vertical threshold, the detection of the lens cap being present in Step 406 is rejected as a false positive.

In one or more embodiments, the distinction between the true and false positive of the lens cap being present is used to prevent the detection of the lens cap as being present, even though the lens cap is merely placed on top of the video conferencing device (e.g., for storage of the removed lens cap). The lens cap being placed on top of the video conferencing device may result in a horizontal magnetic field value that is very similar to the horizontal magnetic field value that is obtained when the lens cap is actually present (i.e., blocking the view of the camera) because purely based on the horizontal coordinate, the location covering the lens and stored on top of the video conferencing device are very similar. However, examined by the vertical coordinate, the two locations are very different and may thus be distinguished by the vertical magnetic field value, as performed in Step 408. Accordingly, if a false positive is detected, the execution of the method may return to Step 402. If a true positive is detected, the execution of the method may proceed with Step 410.

In Step 410, the lens cap state is updated to ON.

In Step 412, the lens cap state is outputted. The lens cap state may be displayed on a screen by showing a deactivated camera symbol.

Returning to Step 404, as previously discussed, when it is detected that the lens cap state is ON, the method may proceed with the execution of Step 414.

In Step 414, a test is performed to determine whether the horizontal magnetic field value exceeds a lens-cap-on-threshold. The lens-cap-on-threshold may be set such that, the test in Step 414 would predict that the lens cap is absent (i.e., not blocking the view of the camera) when the horizontal magnetic field value is above the lens-cap-on-threshold. When the horizontal magnetic field value is below the lens-cap-on threshold, the test in Step 414 would predict that the lens cap is present, thus blocking the view of the camera. In one or more embodiments, the distinction between the lens cap being present or absent is based on the change of the magnetic field in the x direction. More specifically, when the lens cap is blocking the view of the camera (lens cap present), the horizontal magnetic field sensed by the magnetometer is reduced because the magnetic field of the set of magnets (shown in FIG. 2C) is concentrated in the ferromagnetic component of the lens cap. When the lens cap is absent (i.e., not blocking the view of the camera), the magnetic field is not concentrated in the ferromagnetic component of the lens cap. Because the lens magnetic field is not concentrated in the ferromagnetic component, the magnetometer is exposed to a stronger magnetic field in the x direction. The stronger magnetic field results in an increased horizontal magnetic field sensed by the magnetometer. The lens-cap-off-threshold may be set as a value between the horizontal magnetic field value obtained when the lens cap is present, and the horizontal magnetic field value obtained when the lens cap is absent. By setting the lens-cap-off-threshold to a value between the horizontal magnetic field values when the lens cap is present and the lens cap is absent, the distinction of lens cap present and lens cap absent is enabled.

The lens-cap-on-threshold may be set between the horizontal magnetic field value obtained when the lens cap is present, and the horizontal magnetic field value obtained when the lens cap is absent, to enable the distinction of lens cap present and lens cap absent. If the horizontal magnetic field value exceeds the lens-cap-on-threshold, the execution of the method may proceed with Step 416. If the horizontal magnetic field value fails to exceed the lens cap off threshold, the execution of the method may return to Step 402, without updating the lens cap state.

In Step 416, the lens cap state is updated to OFF.

In Step 412, the lens cap state is outputted. The lens cap state may be displayed on a screen by showing an activated camera symbol.

Turning to FIG. 5, a method (500) for obtaining a magnetometer readout, in accordance with one or more embodiments of the disclosure, is shown.

In Step 502, magnetometer data values are obtained. For example, three magnetometer data values may be obtained: a first value in an x-direction, a second value in a y-direction and a third value in a z-direction, based on the reference frame introduced in FIG. 3. The x-direction may be defined as being in a forward direction of the video conferencing device, e.g., perpendicular to the front surface of the video conferencing device. The y-direction may be defined as being toward the right when facing the front surface of the video conferencing device, and perpendicular to the x-axis. The z-direction may be defined as upward when facing the front surface of the video conferencing device, and perpendicular to the x and y axes. Those skilled in the art will appreciate that the x, y, and z axes may differ from the internal reference frame of the magnetometer, depending on the orientation of the magnetometer inside the body of the video conferencing device. Any remapping of axes associated with the magnetometer and the x, y, and z axes as previously defined may be performed, without departing from the disclosure. The magnetometer data values may be periodically obtained, e.g., at a sampling rate of 100 msec.

In Step 504, a current average magnetometer readout is generated. The current average magnetometer readout may be computed by averaging over a number of consecutive data values, including, for example, 7 to 10 data values. The averaging may reduce the noise on the magnetometer data values obtained in Step 402. After the execution of Step 404, the current average magnetometer readout may include averaged magnetometer data values in the x, y, and z directions.

In Step 506, a past average magnetometer readout is generated. The past average magnetometer readout may be an older current average magnetometer readout (as obtained in Step 504). Accordingly, the past average magnetometer readout may also include 7 to 10 data values. The past average magnetometer readout may be separated in time from the current average magnetometer readout. For example, there may be a gap of 500 msec (5 data values at a sampling rate of 100 msec) between the current average magnetometer readout and the past average magnetometer readout.

While the methods described in FIGS. 4 and 5 are based on a configuration such as shown, for example, in FIGS. 1, 2A, 2B, 2C, and 3, those skilled in the art will appreciate that the use of a magnetometer to determine the state of a lens cap generalizes to other configurations, including configurations that are oriented differently (with a coordinate system deviating from the coordinate system used throughout the description), configurations that use different types of lens caps, e.g., slidable lens caps, rotatable lens caps, etc. Further, while the description is based on sensing a magnetic field produced by stationary magnets, and that is changed due to interference resulting from movement of a ferromagnetic object, in alternative embodiments, movement of non-stationary magnets may be directly sensed.

Embodiments of the disclosure, thus, enable the detection of a presence vs absence of a lens cap. This may give a user or users the peace of mind that privacy is protected. A magnetometer is used for the detection of the lens cap. Due to the sensitivity of the magnetometer, the change of the magnetic field may be detected over a significant distance, e.g., over multiple centimeters or more. Accordingly, unlike in other solutions that rely on mechanical switches or hall sensors, the magnetometer does not need to be placed in direct proximity to the lens cap. The magnetometer may be placed on an existing circuit board, and may thus, avoid additional wiring or other complexity, thereby also reducing cost.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A video system comprising:
   a camera;
   at least one magnet providing a magnetic field;

a magnetometer configured to measure the magnetic field to generate a magnetometer readout,
    wherein the magnetic field is altered when a lens cap blocks a view of the camera; and
a processing system, configured to:
    detect, based on the magnetometer readout of the magnetic field, whether the lens cap is blocking the view of the camera,
    wherein detecting whether the lens cap is blocking the view of the camera comprises:
        obtaining a horizontal magnetic field value from the magnetometer readout;
        detecting a current lens cap state indicating that the lens cap is blocking the view of the camera;
        determining that the horizontal magnetic field value exceeds a cap on-threshold; and
        based on detecting that the lens cap is blocking the view of the camera and based on determining that the horizontal magnetic field value exceeds a cap on-threshold:
            updating the current lens cap state to indicate that the lens cap is not blocking the view of the camera.

2. The video system of claim 1, wherein the at least one magnet comprises a first magnet and a second magnet disposed on substantially opposite sides of the camera.

3. The video system of claim 2, wherein the first and the second magnets are oriented to have opposing polarities.

4. The video system of claim 1, wherein the magnetometer is at least two centimeters away from the lens cap when blocking the view of the camera.

5. The video system of claim 1, further comprising the lens cap.

6. The video system of claim 5, wherein the lens cap is removably retained by the at least one magnet.

7. The video system of claim 5, wherein the lens cap comprises a ferromagnetic component.

8. The video system of claim 5, wherein the lens cap is one selected from a group consisting of slidable or rotatable.

9. The video system of claim 1, wherein the magnetometer shares a printed circuit board with user interface components of the video system.

10. The video system of claim 1, wherein the video system is a video conferencing device.

11. A video system comprising:
a camera;
at least one magnet providing a magnetic field;
a magnetometer configured to measure the magnetic field to generate a magnetometer readout,
    wherein the magnetic field is altered when a lens cap blocks a view of the camera; and
a processing system, configured to:
    detect, based on the magnetometer readout of the magnetic field, whether the lens cap is blocking the view of the camera,
    wherein detecting whether the lens cap is blocking the view of the camera comprises:
        obtaining a horizontal magnetic field value from the magnetometer readout;
        detecting a current lens cap state indicating that the lens cap is not blocking the view of the camera;
        determining that the horizontal magnetic field value is below a cap off-threshold; and
        based on detecting that the lens cap is not blocking the view of the camera and based on determining that the horizontal magnetic field value exceeds a cap off-threshold:
            updating the current lens cap state to indicate that the lens cap is blocking the view of the camera.

12. The video system of claim 11, wherein distinguishing, based on the magnetometer readout of the magnetic field, between the lens cap blocking the view of the camera and the lens cap not blocking the view of the camera further comprises, prior to updating the current lens cap state to indicate that the lens cap is blocking the view of the camera:
    obtaining a change in a vertical magnetic field value from the magnetometer readout; and
    determining that the change in the vertical magnetic field value exceeds a vertical threshold.

13. The video system of claim 11, further comprising: the lens cap, wherein the lens cap is slidable or rotatable.

14. The video system of claim 11, wherein the video system is a video conferencing device.

15. A method for detecting a lens cap on a camera, the method comprising:
    obtaining a magnetometer readout from a magnetometer configured to measure a magnetic field,
        wherein the magnetic field is provided by at least one magnet, and
        wherein the magnetic field is altered when the lens cap blocks a view of the camera; and
    detecting, based on a magnetometer readout of the magnetic field, whether the lens cap is blocking the view of the camera,
    wherein detecting whether the lens cap is blocking the view of the camera comprises:
        obtaining a horizontal magnetic field value from the magnetometer readout;
        detecting a current lens cap state indicating that the lens cap is blocking the view of the camera;
        determining that the horizontal magnetic field value exceeds a cap on-threshold; and
        based on detecting that the lens cap is blocking the view of the camera and based on determining that the horizontal magnetic field value exceeds a cap on-threshold:
            updating the current lens cap state to indicate that the lens cap is not blocking the view of the camera.

16. The method of claim 15, wherein obtaining the magnetometer readout comprises:
    averaging over a number of consecutive data values obtained from the magnetometer.

17. The method of claim 15, wherein the lens cap is slidable or rotatable.

18. A method for detecting a lens cap on a camera, the method comprising:
    obtaining a magnetometer readout from a magnetometer configured to measure a magnetic field,
        wherein the magnetic field is provided by at least one magnet, and
        wherein the magnetic field is altered when the lens cap blocks a view of the camera; and
    detecting, based on a magnetometer readout of the magnetic field, whether the lens cap is blocking the view of the camera,
    wherein detecting whether the lens cap is blocking the view of the camera comprises:
        obtaining a horizontal magnetic field value from the magnetometer readout;
        detecting a current lens cap state indicating that the lens cap is not blocking the view of the camera;
        determining that the horizontal magnetic field value is below a cap off-threshold; and based on detecting that the lens cap is not blocking the view of the camera and based on determining that the horizontal magnetic field value exceeds a cap off-threshold:
    updating the current lens cap state to indicate that the lens cap is blocking the view of the camera.

19. The method of claim 18, wherein distinguishing, based on the magnetometer readout of the magnetic field, between the lens cap blocking the view of the camera and the lens cap not blocking the view of the camera further comprises, prior to updating the current lens cap state to indicate that the lens cap is blocking the view of the camera:
    obtaining a change in a vertical magnetic field value from the magnetometer readout; and
    determining that the change in the vertical magnetic field value exceeds a vertical threshold.

20. The method of claim 19, further comprising:
    subtracting a past magnetometer readout from the magnetometer readout to obtain the change in the vertical magnetic field value.

* * * * *